United States Patent [19]

Münzel

[11] Patent Number: 4,493,259
[45] Date of Patent: Jan. 15, 1985

[54] CONTROL CIRCUIT FOR IGNITING A LOW-OHM IGNITION CAPSULE

[75] Inventor: Klaus Münzel, Klingnau, Switzerland

[73] Assignee: Werkzeugmaschinenfabrik Oerlikon-Bührle AG, Zürich, Switzerland

[21] Appl. No.: 415,238

[22] Filed: Sep. 7, 1982

[30] Foreign Application Priority Data

Sep. 24, 1981 [CH] Switzerland .......................... 6153/81

[51] Int. Cl.³ .............................................. F42C 11/06
[52] U.S. Cl. ...................................... 102/218; 102/206
[58] Field of Search ..................... 102/218, 220, 206

[56] References Cited

U.S. PATENT DOCUMENTS

| | | | |
|---|---|---|---|
| 3,638,035 | 1/1972 | Murphy et al. | 307/141 |
| 3,788,226 | 1/1974 | Fillmore et al. | 102/220 |
| 4,240,350 | 12/1980 | Munzel et al. | 102/206 |
| 4,296,688 | 10/1981 | Orlandi | 102/218 |

FOREIGN PATENT DOCUMENTS

| | | | |
|---|---|---|---|
| 8835 | 9/1979 | European Pat. Off. | 102/218 |
| 1955025 | 8/1971 | Fed. Rep. of Germany | 102/218 |
| 2750972 | 5/1979 | Fed. Rep. of Germany | 102/206 |
| 2905077 | 8/1980 | Fed. Rep. of Germany | 102/218 |

Primary Examiner—Charles T. Jordan
Attorney, Agent, or Firm—Werner W. Kleeman

[57] ABSTRACT

For small calibre projectiles the electrical energy needed for igniting a low-ohm ignition capsule is stored in a supply or ignition capacitor which, upon firing of the projectile, is charged by a current generator. To ensure that during charging of the supply capacitor upon firing of the projectile, the ignition capsule does not prematurely ignite, there are provided safety circuits, in particular a static blocking circuit, a dynamic blocking circuit and a static delatching circuit.

6 Claims, 3 Drawing Figures

CONTROL CIRCUIT FOR IGNITING A LOW-OHM IGNITION CAPSULE

BACKGROUND OF THE INVENTION

The present invention relates to a new and improved construction of a control circuit for the ignition of a low-ohm ignition capsule or pill by means of a power switch and containing a voltage source.

A state-of-the-art control circuit of this type has been disclosed in German Pat. No. 2,750,972. This circuit serves for controlling low-ohm loads by means of a power switch connected with a current source, especially for controlling low-ohm ignition capsules in ignition circuits.

If such circuitry is used in conjunction with a projectile where there is available a supply or feed capacitor as the current source, which first is charged by a current generator upon firing of the projectile, then it is necessary to undertake certain protective measures, namely:
  (a) it is necessary to prevent that, upon charging of the supply capacitor, the ignition capsule will be ignited before there has been attained a minimum voltage.
  (b) upon malfunction of the supply capacitor there is present the danger that because of a rapid speed of ascent or rise of the voltage there will occur a premature ignition of the ignition capsule, especially if there are present undesired spurious signals.

With the aforementioned prior art control circuit there are not provided any protective devices which preclude any premature ignition of the ignition capsule or the like in the event that there arises any one or both of the aforementioned situations.

SUMMARY OF THE INVENTION

Therefore, with the foregoing in mind it is a primary object of the present invention to provide a new and improved construction of control circuit for igniting a low-ohm ignition capsule or the like in a positive and reliable manner and which is not associated with the aforementioned shortcomings of the state-of-the-art proposals.

Another and more specific object of the present invention is directed to an improved control circuit which prevents any premature ignition of the ignition capsule or the like during charging of a supply capacitor, and in the event of malfunction of the supply capacitor precludes any premature ignition of the ignition capsule because of a large speed of ascent or rise of the voltage and/or the presence of undesired spurious signals.

Now in order to implement these and still further objects of the invention, which will become more readily apparent as the description proceeds, the control circuit of the present development is manifested by the features that:
  (a) an ignition or supply capacitor is provided which can be charged by the supply voltage, the ignition capacitor being connected with the power switch and with the ignition capsule;
  (b) there is provided a static blocking circuit which prevents ignition of the ignition capsule as long as the ignition capacitor is being charged, and a transistor connects the base of the power switch with ground;
  (c) a static delatching circuit is provided which eliminates the blocking action as soon as the ignition capacitor has been charged, and a Zener diode serves to switch-off the static blocking circuit as soon as the voltage of the ignition capacitor has reached a threshold value of the Zener diode; and
  (d) a dynamic blocking circuit is provided which, upon malfunction or failure of the ignition capacitor, prevents an unintentional ignition of the ignition capsule during the intentional charging of the ignition capacitor, and such dynamic blocking circuit is provided with a capacitor.

A particular advantage of this circuit design resides in the fact that there only is used bipolar technology. Therefore, integration of the circuit is easily possible. A further advantage resides in the fact that, by monitoring the capacitor voltage there can be designed an extremely disturbance-free control circuit. Additionally, the space requirements of this control circuit are relatively small or modest, so that there is facilitated its incorporation into a projectile. Moreover, the control circuit possesses a low power dissipation in the quiescent or static state.

BRIEF DESCRIPTION OF THE DRAWINGS

The invention will be better understood and objects other than those set forth above, will become apparent when consideration is given to the following detailed description thereof. Such description makes reference to the annexed drawings wherein.

DETAILED DESCRIPTION OF THE PREFERRED EMBODIMENTS

Figure 1:
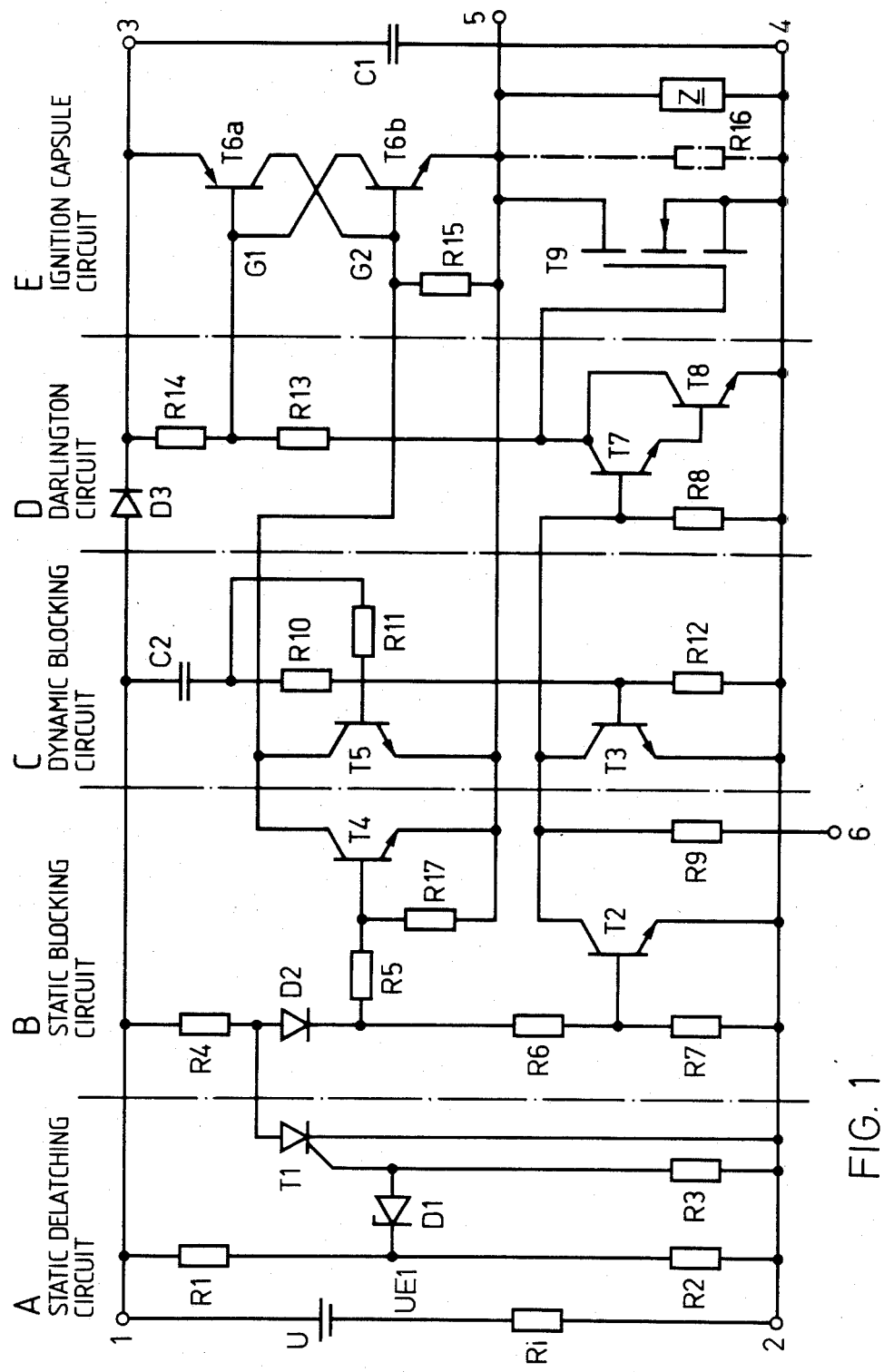
FIG. 1 is a circuit diagram of a control circuit or apparatus constructed according to the invention, wherein the related components have been shown bounded between essentially vertically extending broken lines.

Describing now the drawings, by referring to FIG. 1 it will be recognised that the control circuit or apparatus for the ignition of a low-ohm ignition capsule or pill or the like, depicted therein by way of example and not limitation, is composed of the following circuit sections or partial circuits:
  A—delatching circuit;
  B—static blocking circuit;
  C—dynamic blocking circuit;
  D—Darlington circuit; and
  E—ignition capsule circuit.

In the description to follow there will be described the various circuit sections A, B, C, D and E in greater detail.

The Ignition Capsule Circuit E

According to the showing of FIG. 1, the control circuit for the ignition of a detonator or a low-ohm ignition capsule or pill Z or the like possesses an ignition capacitor C1 which, on the one hand, is connected by means of the terminals 3 and 1 and, on the other hand, by means of the terminals 4 and 2, with a suitable voltage source U. The ignition capsule Z is connected, on the one hand, by means of two transistors T6b and T6a with the terminals 3 and 1 and, on the other hand, with the terminals 4 and 2, as shown. The control of both transistors T6b and T6a is accomplished from the node or junction points G1 and G2. Moreover, the ignition capsule Z is short-circuited by means of the terminals 4 and 5 and by means of an ohmic resistance or resistor R16 or a C-MOS-switch T9.

The Darlington Circuit D

For the purpose of controlling the transistors T6b and T6a there is used a Darlington circuit or amplifier which is formed by two transistors T7 and T8. The input of the transistor T8 is connected by means of two ohmic resistors R13 and R14 with the terminals 3 and 1 and the output of the transistor T8 is directly connected with the terminals 4 and 2, as shown. The base of the transistor T8 is connected with the output of the transistor T7 and the input of the transistor T7 is likewise connected by means of both the ohmic resistors R13 and R14 with the terminals 3 and 1, again as shown. At the base of the transistor T7 there is connected a control input 6 by means of an ohmic resistor R9. The output of the transistor T8 is connected by means of a resistor R8 with the base of the transistor T7.

The Static Blocking Circuit B

In order to be able to reliably charge the ignition or supply capacitor C1, without the ignition capsule Z or the like igniting during the charging operation, there is provided a static blocking circuit B. This static blocking circuit B contains two transistors T4 and T2 and five ohmic resistors or resistances R4, R5, R6, R7 and R17. The transistor T4 connects the output of the transistor T6b with its base, and the transistor T2 connects the output of the above-mentioned Darlington circuit D with its base, i.e. the output of the transistor T8 with the base of the transistor T7. The base of the transistor T4 is connected, on the one hand, by means of the ohmic resistors R5 and R4 with the terminals 3 and 1 and, on the other hand, by means of the ohmic resistor R17 with the output of the transistor T6b. The base of the transistor T2 is connected, on the one hand, by means of the ohmic resistors R6 and R4 with the terminals 3 and 1 and, on the other hand, by means of the ohmic resistor R7 with the terminals 4 and 2.

The Dynamic Blocking Circuit C

In the event that the capacitor C1 is defective then a sudden voltage increase or surge could cause an undesired ignition of the ignition capsule Z. To avoid this unintentional ignition there is advantageously provided a dynamic blocking circuit C. This dynamic blocking circuit C comprises two transistors T3 and T5, the three ohmic resistors R10, R11 and R12 and a capacitor C2. Just as was the case for the transistor T2, the first transistor T3 connects the output of the Darlington circuit D with its base, i.e. the output of the transistor T8 with the base of the transistor T7. Equally, just as was the case for the transistor T4, the second transistor T5 connects the output of the transistor T6b with its base. The base of the transistor T3 is connected, on the one hand, by means of the ohmic resistor R10 and the capacitor C2 with the terminals 3 and 1 and, on the other hand, by means of the ohmic resistor R12 with the terminals 4 and 2. The base of the transistor T5 is connected, on the one hand, by means of the ohmic resistor R11 and the capacitor C2 with the terminals 3 and 1 and, on the other hand, by means of the ohmic resistors R11, R10 and R12 with the terminals 4 and 2.

The Static Delatching Circuit A

After charging of the capacitor C1 the static blocking circuit B can be disabled. For this purpose there is provided a static delatching or release circuit A. This delatching or release circuit A consists of a thyristor T1, a Zener diode D1 and three ohmic resistors R1, R2 and R3. Both of the ohmic resistors R1 and R2 connect the terminals 1 and 2 with one another and form a voltage divider. Between the resistors R1 and R2 there therefore appears the voltage UE1. Connected with this voltage UE1 is the thyristor T1 by means of the Zener diode D1. The thyristor T1 connects the ohmic resistor R4, which is connected with the terminal 1, with the terminal 2. Furthermore, the Zener diode D1 is connected by means of a resistor R3 with the terminal 2.

Figure 2:
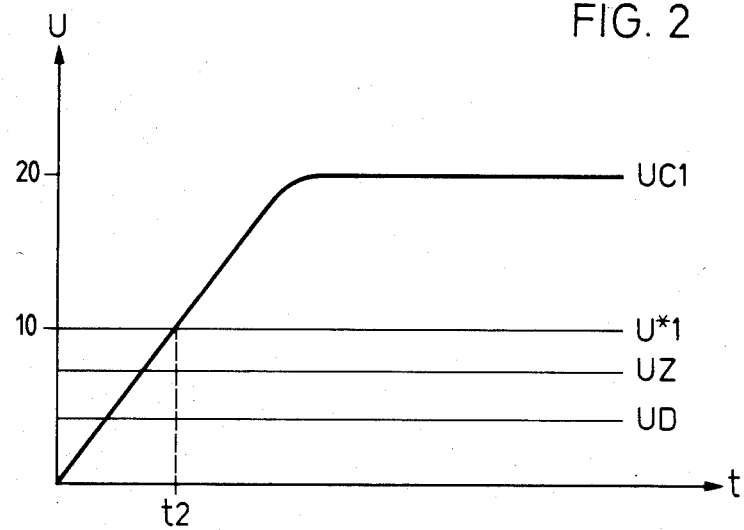
FIG. 2 is a diagram illustrating the voltage course during charging of the ignition or supply capacitor.

The mode of operation of the described control circuit will now be considered and is as follows:

As soon as the control circuit is connected with the voltage source U there is formed at the terminal 1 the input voltage U and between the ohmic resistors R1 and R2 the input voltage UE1. The capacitor C1 begins to charge and there is formed at the terminal 3 the voltage UC1 (FIG. 2).

During the charging operation the static blocking circuit B is effective, since voltage is applied by means of the resistors R4 and R5 to the base of the transistor T4, so that such becomes conductive. Equally, by means of the resistors R4 and R6 voltage is applied to the base of the transistor T2 and such likewise becomes conductive. During such time as the transistor T4 is conductive the transistors T6a and T6b remain disabled or blocked and as long as the transistor T2 is conductive the Darlington stage, and thus, also the control input 6 is blocked. According to the showing of FIG. 2, the capacitor voltage UC1 increases during this time to the value U*1. Hence, there also increases the voltage UE1.

As soon as the voltage UE1 exceeds the threshold value of the Zener diode D1, this Zener diode D1 becomes conductive and there is applied voltage to the gate input of the thyristor T1, so that such likewise becomes conductive. Consequently, there disappears the voltage U*1 at the base of the transistors T4 and T2, so that such no longer are conductive. Hence, the action of the static blocking circuit B is eliminated.

In the event that there is applied a voltage or potential to the base of the Darlington circuit D by means of the control input 6, then this Darlington circuit D becomes conductive and there appears a voltage at the base of the transistor T6a, so that such becomes conductive and there appears a voltage or potential at the base of the transistor T6b. Hence, the transistor T6b also becomes conductive and the ignition capsule Z or the like can be ignited.

Figure 3:
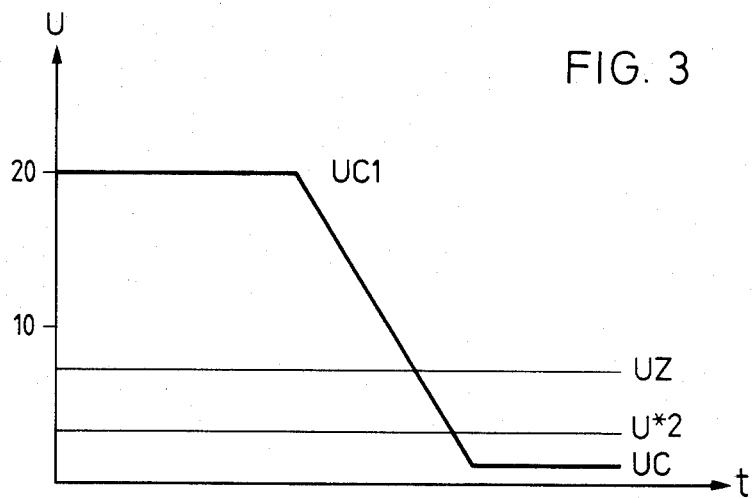
FIG. 3 is a diagram illustrating the voltage course during discharge of the ignition or supply capacitor.

Upon ignition of the ignition capsule Z the voltage at the capacitor C1 drops according to the showing of FIG. 3. As soon as the capacitor voltage UC1 drops to the blocking voltage U*2, then there occurs an active blocking of the transistors T6a and T6b. The value of the blocking voltage U*2, during discharge of the capacitor C1, is appreciably smaller than the value of the blocking voltage U*1 during charging of the capacitor C1, since the thyristor T1 first switches-off in the presence of an extremely low value of the capacitor voltage UC1.

In FIGS. 2 and 3 there have been plotted the minimum ignition voltage UZ of the ignition capsule Z and the voltage UD needed for controlling the Darlington circuit D. In the event that the capacitor C1 malfunctions because of a disturbance, then the voltage does not increase at the time t2, in the manner as shown in FIG. 2, rather rises appreciably more rapidly. In the event that there is present, during such voltage rise or ascent, a spurious voltage at the control input 6, then the voltage rise or ascent velocity can be so great that the static blocking circuit B is not effective. For this case there is provided the dynamic blocking circuit C. By means of the aforementioned voltage rise the second capacitor C2 is charged, so that, on the one hand, by means of the resistor R10 there is applied a voltage or potential to the base of the transistor T3 and, on the other hand, by means of the resistor R11 a voltage or potential is applied to the base of the transistor T5. The transistors T3 and T5 become conductive, and just as was the case for the transistors T2 and T4, cause, on the one hand, the Darlington circuit D and, on the other hand, the transistors T6a and T6b to remain blocked.

The diode D3 prevents that the ignition or supply capacitor C1 can discharge at the voltage source or battery U or in a not particularly illustrated current generator. Hence, the ignition capacitor C1 can only discharge by means of possible leakage currents of the diode D3 or the transistors T6a and T6b or the transistors T7 and T8 of the Darlington circuit D. In other words, the power dissipation of the described circuit configuration is small. Instead of using the ohmic resistor R16 there can be provided a C-MOS transistor T9 which, upon ignition of the ignition capsule Z, is blocked by the Darlington circuit D, so that the entire current flows through the ignition capsule Z. On the other hand, in the case of the ohmic resistor R16 it cannot be avoided that, upon ignition of the ignition capsule Z, a portion of the current, for instance, 10% also will flow through the ohmic resistor or resistance R16.

The Darlington circuit D containing the transistors T7 and T8 ensures for a reliable ignition of the ignition capsule Z or the like by means of both of the transistors T6a and T6b. The voltage at the control input 6 should not, however, be smaller than 2.5 volts. By virtue of the high current amplification of the Darlington circuit or amplifier D the transistors T6a and T6b also can be controlled by a C-MOS transistor.

As will be apparent from the illustration of FIG. 2, by means of the static delatching or release circuit A there is first eliminated the blocking action of the static blocking circuit B in the presence of a voltage U*1 which is greater than the ignition voltage UZ and smaller than the maximum capacitor charging voltage UC1.

In this context there is valid:

$$UZ < U^*1 < UC1$$

As will also be apparent from the showing of FIG. 3, the blocking action first will be initiated, during the discharge of the ignition capacitor C1, with a blocking voltage U*2 which is smaller than the ignition voltage UZ. Hence there is valid:

$$U^*2 < UZ$$

By virtue of this condition there is beneficially avoided that the ignition capacitor C1 will discharge across the resistor R9 and the transistor T2.

While there are shown and described present preferred embodiments of the invention, it is to be distinctly understood that the invention is not limited thereto, but may be otherwise variously embodied and practiced within the scope of the following claims. Accordingly,

I claim:

1. A control circuit for igniting a low-ohm ignition capsule, comprising:
   a voltage source;
   power switch means connected in circuit with said low-ohm ignition capsule;
   an ignition capacitor connected in circuit with said voltage source and chargeable by means of said voltage source;
   said ignition capacitor being connected in circuit with said power switch means and with said ignition capsule;
   a static blocking circuit for exerting a blocking action preventing ignition of the ignition capsule as long as the ignition capacitor is being charged;
   said power switch means having a base;
   said static blocking circuit containing a first transistor for connecting the base of said power switch means with ground;
   a static delatching circuit which eliminates the blocking action of the static blocking circuit as soon as the ignition capacitor has been charged;
   said static delatching circuit containing a Zener diode for disconnecting said static blocking circuit as soon as the voltage of the ignition capacitor has reached a threshold voltage of said Zener diode;
   a dynamic blocking circuit for preventing an unintentional ignition of said ignition capsule during the intentional charging of the ignition capacitor upon malfunction of said ignition capacitor; and
   said dynamic blocking circuit containing a capacitor.

2. The control circuit as defined in claim 1, wherein:
   said static delatching circuit further comprises:
      a voltage divider containing two ohmic resistors for generating a divider voltage;
      a thyristor; and
      said Zener diode being connected with said voltage divider and with said thyristor as soon as the voltage of the voltage divider exceeds the threshold value of the Zener diode.

3. The control circuit as defined in claim 2, wherein:
   said static blocking circuit further comprises:
      a voltage divider containing three ohmic resistors for generating a divider voltage;
      a second transistor; and
      said first and second transistors each having a base connected with said voltage divider of said static blocking circuit.

4. The control circuit as defined in claim 1, wherein:
   said dynamic blocking circuit further comprises:
      a voltage divider containing said capacitor and two ohmic resistors for generating a divider voltage; and
      two transistors, each having a base connected with said voltage divider of said dynamic blocking circuit.

5. The control circuit as defined in claim 3, further including:
   a Darlington circuit operatively connected with said dynamic blocking circuit; and
   said second transistor of said static blocking circuit connecting a base of a transistor of the Darlington circuit with ground.

6. The control circuit as defined in claim 5, wherein:

said dynamic blocking circuit further comprises:
  a voltage divider containing said capacitor and two ohmic resistors for generating a divider voltage; and
  two transistors, each having a base connected with said voltage divider of said dynamic blocking circuit;
said two transistors of said dynamic blocking circuit define a first transistor and a second transistor; and
said second transistor of said dynamic blocking circuit connecting the base of the transistor of the Darlington circuit with ground.

* * * * *